(12) United States Patent
Yang et al.

(10) Patent No.: US 8,052,883 B2
(45) Date of Patent: Nov. 8, 2011

(54) METHOD FOR FORMING PERIODIC STRUCTURE

(75) Inventors: Chih-Chung Yang, Taipei (TW); Cheng-Yen Chen, Taipei (TW); Cheng-Hung Lin, Taipei (TW); Dong-Ming Yeh, Taipei (TW)

(73) Assignee: National Taiwan University, Taipei (TW)

( * ) Notice: Subject to any disclaimer, the term of this patent is extended or adjusted under 35 U.S.C. 154(b) by 778 days.

(21) Appl. No.: 12/115,998

(22) Filed: May 6, 2008

(65) Prior Publication Data
US 2009/0227109 A1   Sep. 10, 2009

(30) Foreign Application Priority Data

Mar. 5, 2008 (TW) ................................ 97107635 A

(51) Int. Cl.
*B29D 11/00* (2006.01)
(52) U.S. Cl. ................................ 216/24; 216/26; 216/95
(58) Field of Classification Search .................... 216/24, 216/26, 94, 95; 438/745, 746
See application file for complete search history.

(56) References Cited

U.S. PATENT DOCUMENTS

| | | | | |
|---|---|---|---|---|
| 4,415,414 A * | 11/1983 | Burton et al. | ................. | 205/655 |
| 6,618,174 B2 * | 9/2003 | Parker et al. | .................... | 359/15 |
| 2007/0190676 A1 * | 8/2007 | Chu et al. | ........................ | 438/22 |

* cited by examiner

*Primary Examiner* — Lan Vinh

(57) ABSTRACT

A method for forming a periodic structure is disclosed. A structural layer and an optical modulation element are provided. A light is emitted to pass through the optical modulation element to irradiate interference strips on the structural layer. A photoelectrochemical etching (PEC) is performed to form the periodic structure according the interference strips irradiated on the structural layer.

16 Claims, 4 Drawing Sheets

METHOD FOR FORMING PERIODIC STRUCTURE

BACKGROUND OF THE INVENTION

1. Field of the Invention

The invention relates to a method for forming a periodic structure, such as photonic crystal, and more particularly relates a method for forming a periodic structure in a light-emitting device.

2. Description of the Related Art

Optoelectronic technology has rapidly developed, and is currently in wide usage, thus improving the wellbeing of mankind.

In recent years, due to structure and process development of photonic crystals, application potential for photonic crystals has increased. Basically, photonic crystal is a structure with a periodic varying refractive index or dielectric constant and simulates arrangement of atoms in a solid crystal. Photonic crystals are similar to the energy gap of electrons in solid crystals and generates energy gap of photons therein. Hence, transmissive characteristics of electromagnetic waves, such as amplitude, phase, polarization or wavelength, can be changed by adjusting characteristics of photonic crystals.

Some research has shown that lighting efficiency of a light-emitting diode can be greatly increased by applying photonic-crystal technology to the light-emitting diode. However, fabrication of photonic crystals must use patterning technologies with very small sizes, wherein the size of a photonic crystal is about ¼ that of a wavelength of a light signal in a material, Note that the size for patterning technologies for most optoelectronic applications is about 25 nm~100 nm. Photonic crystals are mainly fabricated by an electron-beam lithography (EBL) and dry etching process to form air holes in a III-V semiconductor. The equipment for forming photonic crystals are very expensive and have low production rates, such that photonic crystals are yet to be mass produced and applied.

BRIEF SUMMARY OF INVENTION

According to the issues described previously, an embodiment of the invention provides a method for forming a periodic structure. A structural layer and an optical modulation element are provided. A light is emitted to pass through the optical modulation element to irradiate interference strips on the structural layer. A photoelectrochemical etching (PEC) process is performed to form the periodic structure according the interference strips irradiated on the structural layer.

The invention alternatively provides a method for forming a light-emitting device. A light-emitting element comprising a first type semiconductor layer is provided. An optical modulation element is provided. A light is emitted to pass through the optical modulation element to irradiate interference strips on the first type semiconductor layer. A photoelectrochemical etching (PEC) process is performed to form the periodic structure according the interference strips irradiated on the first type semiconductor layer.

The invention further provides equipment for fabricating an electronic device, comprising a storage tank containing a electrolyte, an optical modulation element, and a light source for emitting a light to pass through the optical modulation element to irradiate interference strips on the electronic device.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1B:
FIG. 1A and FIG. 1B illustrate the mechanism of the invention.
Figure 1A:
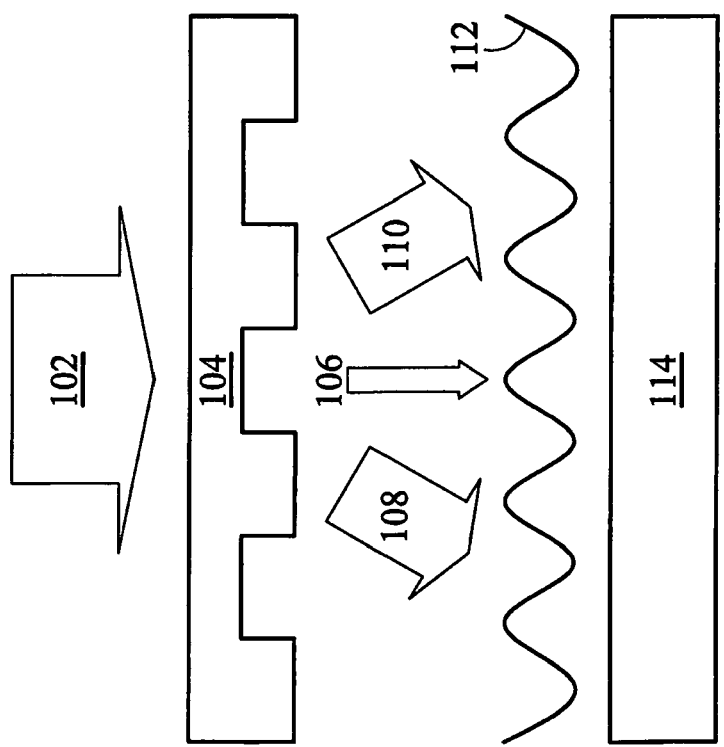

The mechanism of the invention is illustrated in accordance with FIG. 1A and FIG. 1B. As shown in FIG. 1A, when a laser beam 102 passes through a phase mask 104, lights 106, 108 and 110 with different diffraction order, such as 0 order, +1 order and −1 order, are generated, and interference is generated between the major diffraction order lights 108, 110 (+1 order and −1 order lights) to form interference strips 112 on a structural layer 114. The interference strips 112 have different intensity at different positions on the structural layer 114. Next, the structural layer 114 is etched by a photoelectrochemical etching (PEC) process. The mechanism for photoelectrochemical etching is to generate electron-hole pairs on the structural layer 114 by light irradiation for enhancing oxidation and reduction of electrochemistry on the structural layer 114. The etching rate of the PEC process is in direct proportion to the intensity of light. That is, when the intensity of light is increased, the etching rate of the PEC process is increased. Accordingly, as shown in FIG. 1B, a photonic crystal 116 can be formed on the structural layer 114 by the photoelectrochemical etching process combined with the interference strips 112 generated by the laser beam 102 passing through the phase mask 104. In an embodiment of the invention, the photonic crystal 116 has a periodic frequency of about 200~300 nm and a size of about 100~200 nm.

Figure 2A:
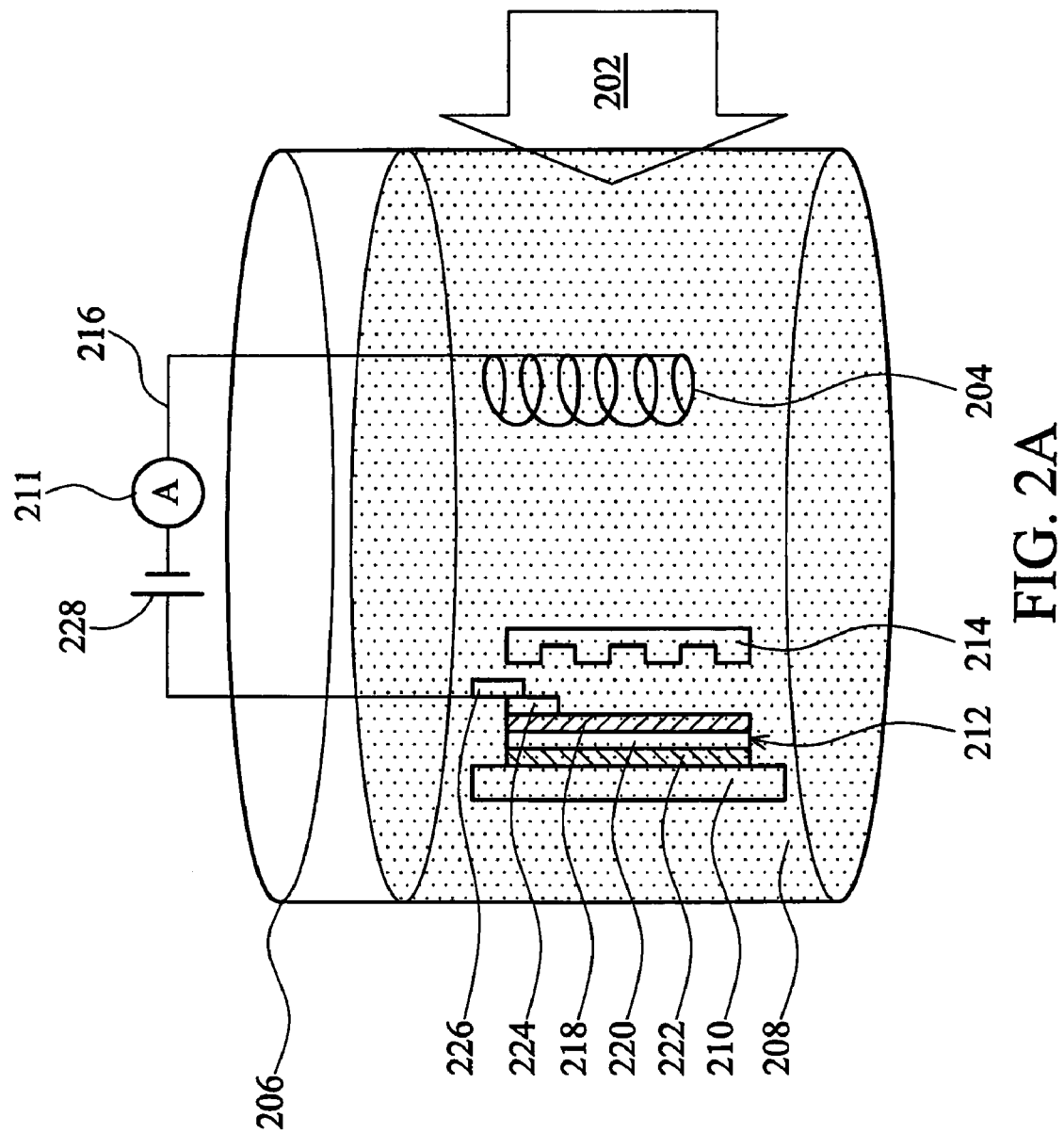
FIG. 2A and FIG. 2B illustrate the method for forming a photonic crystal for a light-emitting device of an embodiment of the invention.
Figure 2B:
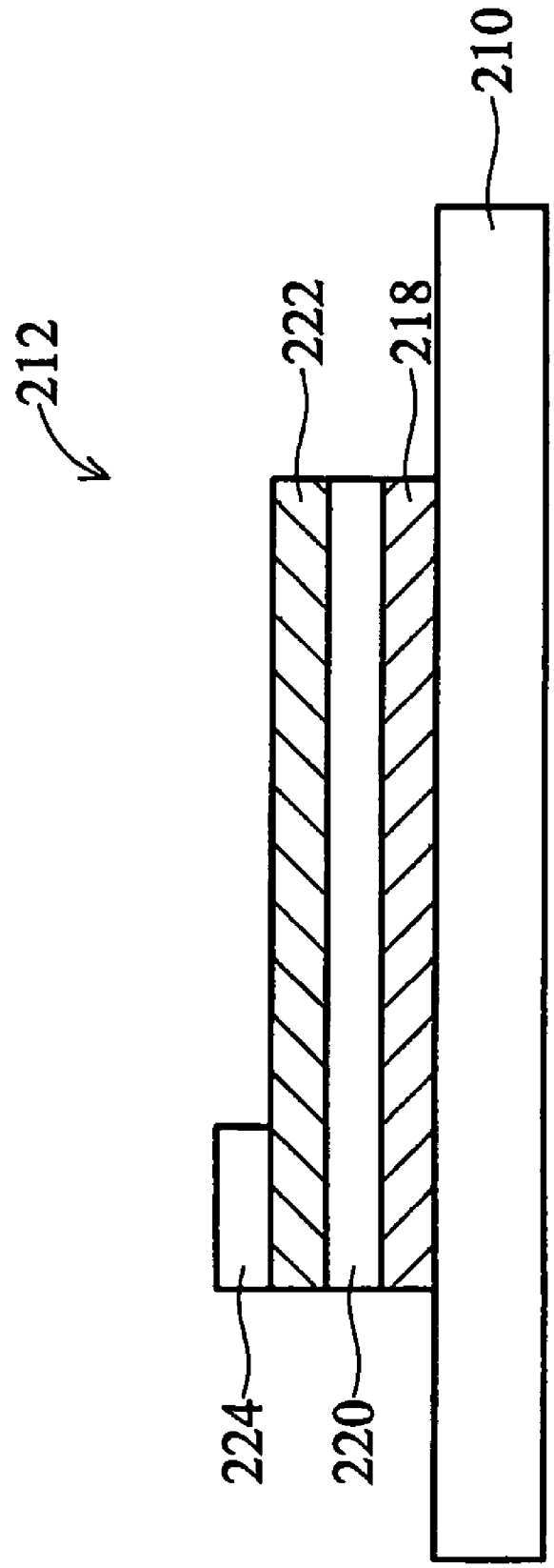

The method for forming photonic crystal of a light-emitting device of an embodiment of the invention is illustrated in accordance with FIG. 2A and FIG. 2B. It is noted that the invention is not only limited to fabrication of light-emitting devices, but also can be applied to other devices or structures related to photonic crystal. Referring to FIG. 2A, a storage tank 206 is provided and an electrolyte 208, which is KOH in the embodiment, is injected therein. A light-emitting device 212 is bonded to a substrate 210 and is immersed into the electrolyte 208. Referring to FIG. 2B, which shows a local enlarged view of FIG. 2A, the light-emitting device 212 is a GaN-based light-emitting diode, at least comprising a first type semiconductor layer 218, an active layer 220 and a second type semiconductor layer 222. The first type semiconductor layer 218 can be n-GaN, the second type semiconductor layer 222 can be p-GaN and the active layer 220 can be InGaN/GaN quantum well. A first type electrode 224, such as a stack layer of Au and Ti, is formed on the first type semiconductor layer 218. Note that the second type electrode or other elements of the light-emitting device 212 is omitted for simplicity. Referring to FIG. 2A again, a first electrode 226, such as platinum used in electrochemistry, contacts the first type electrode 224 of the light-emitting device 212, and a second electrode 204, such as platinum, is immersed in the electrolyte 208. The first electrode 226 and the second electrode 204 are connected by a conductive wire 216.

A light 202 emitted from a coherent light source, such as laser, or an incoherent light source, such as xenon lamp, passes through a phase mask 214 to form interference strips on the first type semiconductor layer 218 of the light-emitting device 212. The light 202 is required to have a photon energy greater than energy gap of GaN for performing the photoelectrochemical etching process. In the embodiment, the light 202 is a He—Cd laser with wavelength of about 325 nm. The first electrode 226 is negative biased by a voltage source 228. The light-emitting device 212 acts as an anode, the second electrode 204 acts as a cathode, and the current is measured by a current meter 211. The embodiment uses a one-dimensional (1-D) phase mask 214 and the light 202 passes through the phase mask 214 to form one-dimensional interference strips on the first type semiconductor layer 218 of the light-emitting device 212 for generating electron-hole pairs thereon. During the PEC process, electrons drift to the second electrode 204 (cathode) and oxidation on the surface of the first type semiconductor layer 218 is enhanced by the holes, in which oxides are dissolved in the electrolytes. The one-dimensional interference strips generate one-dimensional photonic crystal on the first type semiconductor layer 218. Alternatively, another embodiment of the invention can rotate the light-emitting device 212 with a specific angle, such as 90°, and then perform a photoelectrochemical etching process again to form a two-dimensional photonic crystal. It is noted that the invention can alternatively use a two-dimensional phase mask to form a two-dimensional photonic crystal in a single photoelectrochemical etching step. It is noted that the invention is not only limited to using a phase mask, but other optical modulation elements, such as a microlens array, can also be used to form light intensity redistribution on the first type semiconductor layer.

According to the description above, the invention further comprises an equipment for forming a periodic structure in a light-emitting diode 212, comprising a storage tank 206 containing electrolyte 208, an optical modulation element 214, a first electrode 226 connected to a light-emitting device 212 and a light source which can emit light 202 to pass through the optical modulation element 214 to form interference strips.

EXAMPLE

An example and related experiment data is described in the following paragraph to further illustrate the invention. A device is immersed into a KOH solution, which is used as an electrolyte. A Ti/Au layer with thickness of about 12 nm/180 nm is formed on the p-GaN layer of the device to act as a p-type electrode. An Ni/Au layer with thickness of about 30 nm/120 nm is formed on the n-GaN layer of the device to act as a p-type electrode. The semiconductor device is applied with a 0.7V negative bias and irradiated by a He—Cd laser passing through a phase mask to perform a photoelectrochemical etching process, in which interference strips are generated and are used as UV writing beams to pattern the p-GaN layer to form a grating structure.

Figure 3:
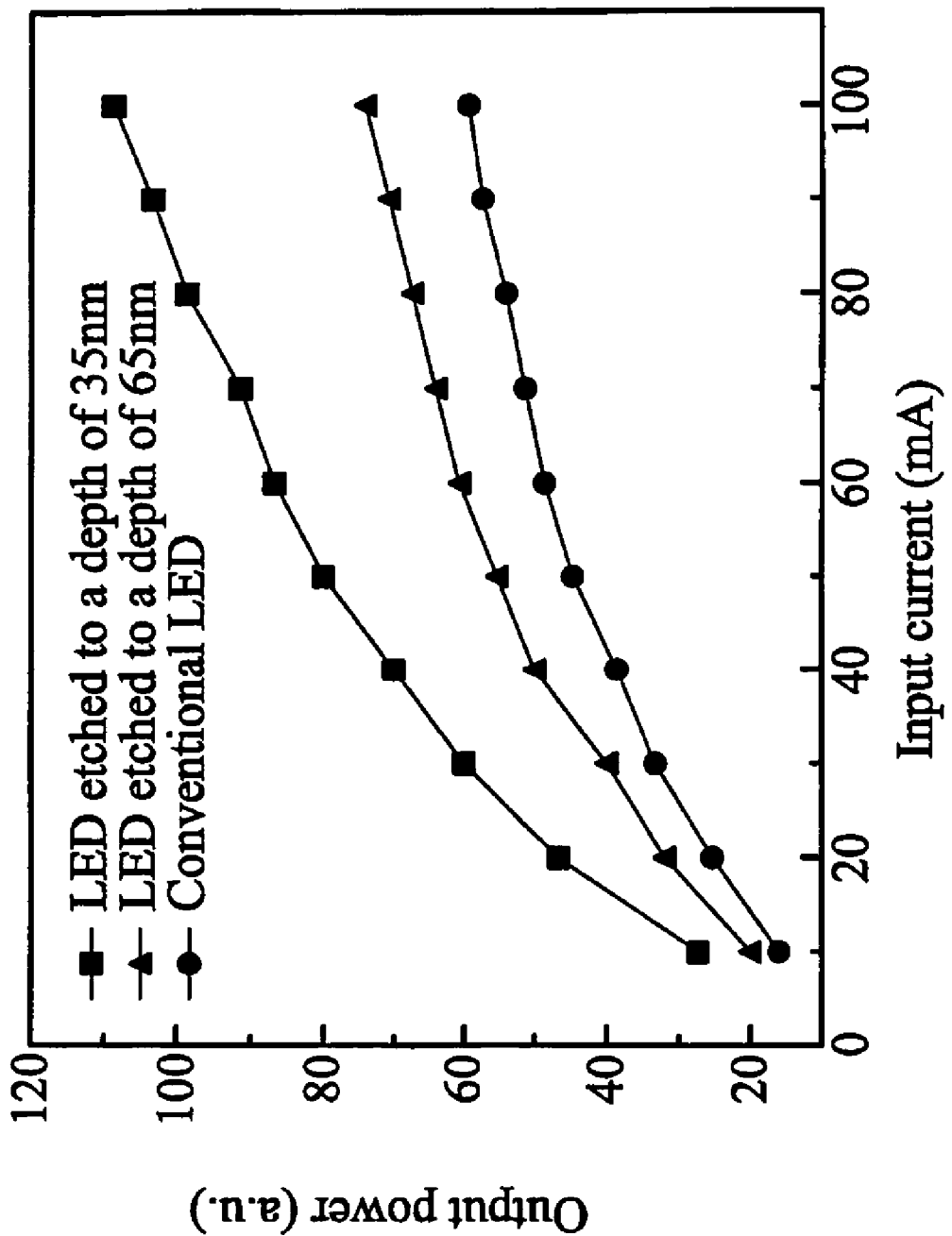
FIG. 3 shows a diagram with output power as a function of input current to compare the light-emitting diode of the example and a conventional light-emitting diode.

FIG. 3 shows comparison of the light-emitting diode of the example and a conventional light-emitting diode. As shown in FIG. 3, the light-emitting device etched by the PEC to a depth of about 35 nm presents greater optical output energy than the other light-emitting device etched by the PEC to a depth of about 65 nm. Further, the light-emitting diode of the example present about 90% higher output energy than the conventional light-emitting diode.

According to the embodiments and the experiment results described, the method of the invention can be used to form a photonic crystal and further be applied to a light-emitting device to enhance emission efficiency or an alternative light-emitting diode to have specific polarization.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a light emitting device, comprising:
    providing a structural layer;
    providing an optical modulation element;
    emitting a light to pass through the optical modulation element to irradiate interference strips on the structural layer;
    performing a photoelectrochemical (PEC) etching process to form the periodic structure according the interference strips irradiated on the structural layer; and
    rotating the light emitting device with a specific angle and performing another photoelectrochemical etching process to form a two-dimensional photonic crystal.

2. The method for forming a periodic structure as claimed in claim 1, wherein the optical modulation element is a phase mask.

3. The method for forming a periodic structure as claimed in claim 1, wherein the optical modulation element is a microlens array.

4. The method for forming a periodic structure as claimed in claim 1, wherein the periodic structure is photonic crystal.

5. The method for forming a periodic structure as claimed in claim 1, wherein the structural layer is a semiconductor layer.

6. The method for forming a periodic structure as claimed in claim 1, wherein the photoelectrochemical etching step immerses the structural layer into an electrolyte, the interference strips have different intensities of light at different positions on the structural layer, and when the intensity of light is increased at a position, the etching rate at the position of the structural layer is increased, wherein the optical modulation element is immersed into the electrolyte.

7. The method for forming a periodic structure as claimed in claim 1, wherein the method does not comprise a lithography step which exposes using a resist as a mask.

8. The method for forming a periodic structure as claimed in claim 1, wherein the specific angle is 90°.

9. A method for forming a light-emitting device, comprising:
    providing a light-emitting element, comprising a first type semiconductor layer;
    providing an optical modulation element;
    emitting a light to pass through the optical modulation element to irradiate interference strips on the first type semiconductor layer; and
    performing a photoelectrochemical (PEC) etching process to form the periodic structure according the interference strips irradiated on the first type semiconductor layer; and
    rotating the light-emitting device with a specific angle and performing another photoelectrochemical etching process to form a two-dimensional photonic crystal.

10. The method for forming a light-emitting device as claimed in claim 9, wherein the optical modulation element is a phase mask or a microlens array.

11. The method for forming a light-emitting device as claimed in claim 9, wherein the first type semiconductor layer is n-GaN or p-GaN.

12. The method for forming a light-emitting device as in claimed in 9, wherein the light-emitting element is a light-emitting diode, and the light-emitting element further comprises a second type semiconductor layer and an active layer between the first type semiconductor layer and the second type semiconductor layer.

13. The method for forming a light-emitting device as claimed in claim 9, wherein the method does not comprise a lithography step which exposes using a resist as a mask 14. The method for forming a light-emitting device as claimed in claim 9, wherein the specific angle is 90°.

15. The method for forming a light-emitting device as claimed in claim 9, wherein the photoelectrochemical etching step immerses the light-emitting device into an electrolyte, the interference strips have different intensity of light at different positions on the light-emitting device, and when the intensity of light is increased at a position, the etching rate at the position of the light-emitting device is increased.

16. The method for forming a light-emitting device as claimed in claim 15, wherein the optical modulation element is immersed into the electrolyte.

* * * * *